United States Patent [19]

Mead et al.

[11] Patent Number: 5,260,592

[45] Date of Patent: * Nov. 9, 1993

[54] INTEGRATING PHOTOSENSOR AND IMAGING SYSTEM HAVING WIDE DYNAMIC RANGE WITH VARACTORS

[75] Inventors: Carver A. Mead, Pasadena; Federico Faggin, Los Altos Hills, both of Calif.

[73] Assignee: Synaptics, Incorporated, San Jose, Calif.

[*] Notice: The portion of the term of this patent subsequent to Mar. 17, 2009 has been disclaimed.

[21] Appl. No.: 760,569

[22] Filed: Sep. 16, 1991

Related U.S. Application Data

[63] Continuation-in-part of Ser. No. 657,128, Feb. 19, 1991, Pat. No. 5,097,305.

[51] Int. Cl.⁵ .............................................. H01L 27/14
[52] U.S. Cl. .................................. 257/291; 257/292; 257/443; 257/448; 307/311; 250/370.01
[58] Field of Search .............. 357/30 P, 30 G, 30 H, 357/30 R, 32, 24 LR, 46, 86, 51; 330/59; 307/311; 250/370.01; 257/290, 291, 292, 293, 294, 443, 458, 448

[56] References Cited

U.S. PATENT DOCUMENTS

| | | | |
|---|---|---|---|
| 3,470,318 | 9/1969 | Webb | 178/7.1 |
| 3,617,823 | 11/1974 | Hofstein | 317/235 |
| 3,909,520 | 9/1975 | Mend et al. | 178/7.1 |
| 3,919,469 | 11/1975 | Kasperkovitz | 178/7.1 |
| 3,946,151 | 3/1976 | Kamiyama et al. | 178/7.1 |
| 4,139,783 | 2/1979 | Engeler | 307/221 |
| 4,156,818 | 5/1979 | Collins et al. | 307/221 |
| 4,224,585 | 9/1980 | Tanaka | 333/165 |
| 4,291,224 | 9/1981 | Shirasu et al. | 250/204 |
| 4,434,441 | 2/1984 | Ishizaki et al. | 358/213 |
| 4,528,684 | 7/1985 | Lida et al. | 377/60 |
| 4,556,800 | 12/1985 | Ohta et al. | 250/578 |
| 4,682,203 | 7/1987 | Konda | 357/30 P X |
| 4,737,832 | 4/1988 | Kyuma | 357/43 X |
| 4,780,605 | 10/1988 | Tiemann | 250/201 |
| 4,783,694 | 11/1988 | Merrill et al. | 357/46 X |
| 4,786,818 | 11/1988 | Mead et al. | 250/578 |
| 4,797,560 | 1/1989 | Berger et al. | 250/578 |
| 4,814,846 | 3/1989 | Matsumoto et al. | 357/30 P |
| 4,847,668 | 7/1989 | Sugawa et al. | 357/30 P |
| 4,876,534 | 10/1989 | Mead et al. | 340/825.95 |
| 4,906,855 | 3/1990 | Berger et al. | 358/213.23 |
| 4,907,059 | 3/1990 | Kobayashi et al. | 357/42 X |
| 4,948,966 | 8/1990 | Arques et al. | 250/208.1 |
| 4,952,788 | 8/1990 | Berger et al. | 250/208.1 |
| 4,959,723 | 9/1990 | Hashimoto | 358/213.11 |
| 4,972,243 | 11/1990 | Sugawa et al. | 357/34 X |
| 5,097,305 | 3/1992 | Mead et al. | 257/443 X |
| 5,132,541 | 7/1992 | Conrads et al. | 257/291 X |

FOREIGN PATENT DOCUMENTS 84304517 2/1984 European Pat. Off. .
91/04633 4/1991 PCT Int'l Appl. .

OTHER PUBLICATIONS

Anders, et al., "Developmental Solid State Imaging System," *IEEE Transactions on Electron Devices*, vol. ED-15, No. 4, Apr. 1968, pp. 191–195.

(List continued on next page.)

*Primary Examiner*—William Mintel
*Attorney, Agent, or Firm*—Kenneth D'Alessandro

[57] ABSTRACT

A bipolar phototransistor comprises both an integrating photosensor and a switching element. The base terminal of the bipolar phototransistor is utilized as the switch-control node for the pixel and its emitter is the output node of the integrating photosensor. A plurality of integrating photosensors may be placed in an array of rows and columns, wherein the bases of all bipolar phototransistors in a row are capacitively coupled together to a common row-select line, and the emitters of all bipolar phototransistors in a column are connected together to a column sense line. The input of a sense amplifier is connected to the sense line of each column of integrating photosensors. An integrating sense amplifier according to the present invention includes an amplifying element having an inverting input connected to the sense line. A capacitor, preferably a varactor, is also connected between the inverting input and output of the amplifying element. An exponential feedback element may be provided in the sense amplifiers for signal compression at high light levels.

23 Claims, 7 Drawing Sheets

OTHER PUBLICATIONS

Dyck and Weckler, "Integrated Arrays of Silicon Photodetectors for Imaging Sensing", *IEEE Transactions on Electron Devices,* vol. ED-15, No. 4 Apr. 1968, pp. 196-201.

"A Solid-State Image Converter" IEE Transactions on Electron Devices, Richard Stewart, vol. ED-15, No. 4, Apr. 1968, pp. 220-225.

Tepper, et al., "Transfer Functions of Imaging Mosaics Utilizing the Charge Storage Phenomena of Transistor Structures," *IEE Transactions on Electron Devices,* vol. ED-15, No. 4, Apr. 1968, pp. 226-237.

Joy, et al., "Phototransistor Operation in the Charge Storage Mode", *IEEE Transactions On Electron Devices,* vol. ED-15, No. 4, Apr. 1968, pp. 237-248.

Callahan, et al., "Performance Characteristics of Pulsed Phototransistor Structures Under Various Conditions", *IEEE Transactions of Electron Devices,* vol. ED $\propto$ 15, No. 4, Apr. 1968, pp. 248-256.

List, "Solid State Imaging—Methods of Approach," IEEE Transactions on Electron Devices, vol. ED-15, No. 4, Apr. 1968, pp. 256-261.

Noble, Self-Scanned Silicon Image Detector Arrays, IEEE Transactions on Electron Devices, vol. ED-15, No. 4, Apr. 1968, pp. 202-209.

Soref, "Monolithic Silicon Mosaics for Fae-Infrared Imaging," IEEE Transactions on Electron Devices, vol. ED-15, No. 4, Apr. 1968, pp. 209-214.

Sadasiv, et al., "T in-Film Circuits for Scanning Image-Sensor Arrays," *IEEE Transactions on Electron Devices,* vol. ED-15, No. 4, Apr. 1968, pp. 215-219.

INTEGRATING PHOTOSENSOR AND IMAGING SYSTEM HAVING WIDE DYNAMIC RANGE WITH VARACTORS

RELATED APPLICATIONS

The present application is a continuation-in-part of co-pending application, Ser. No. 07/657,128, filed Feb. 9, 1991 now U.S. Pat. No. 5,097,305.

BACKGROUND OF THE INVENTION

1. Field of the Invention

The present invention relates to imaging arrays and systems. More particularly, the present invention relates to a single-chip high-sensitivity imaging system for producing serial-scanned outputs.

2. The Prior Art

Imaging circuits typically include a two-dimensional array of photosensors, each of which converts a pixel of light energy from an image into an electrical signal representing the light value of the pixel. The imaging circuit scans the photosensors to read out the electrical signals representing the light values of all pixels from an image.

As a result of the advances in semiconductor technology, single chip imaging circuits are known in the art. The most common single-chip imaging technology is the charge coupled device (CCD) camera. A CCD device operates by accumulating photo-generated charge in potential wells in a semiconductor substrate at or slightly under the surface of the substrate. The depth of these wells is controlled by the voltage on gate electrodes located just above the surface of the substrate. By manipulating the voltage on several of the gates, the accumulated charge can be shifted along the surface to a sensing point, where it is amplified into a signal which can be driven off of the chip.

Using modern MOS processing techniques, the transport of charge in a CCD structure can be accomplished with almost perfect efficiency at video rates; typically less than ten parts per million of the charge in a well is lost in each transfer. In a typical serial-scanned CCD imager, such as is used for video applications, the charge is shifted out once per frame, and hence the total charge in each well is collected over the entire frame time, typically 1/60 second. Sensing technologies which operate in this manner, by accumulating charge over the entire time between scanout events, are called integrating photosensors.

Despite its technical achievements and wide spread commercial success, CCD technology has its limitations. Because the photo-generated charge is shifted directly, the gain of the device (electrons out per photon in) is always less than unity. Because the charge stored in each well is limited, the CCD imager has severe dynamic-range constraints. At the low end, the sensitivity is limited by how small a charge can be sensed above the noise of the readout amplifier. At the high end, the range is limited by the total charge that can be shifted from one well into the next.

To overcome these dynamic-range limitations of the CCD imager, a number of attempts have been made to use phototransistors to sense incoming light, such as seen in Analog VLSI and Neural Systems, by Carver A. Mead, Addison Wesley Publishing Co., 1989, at pp. 260–261. Phototransistors can have gain of over 100 electrons per absorbed photon. In a typical application, the photocurrent from each phototransistor is fed into a device with exponential current-voltage characteristics, such as a pair of diode-connected MOS transistors. The output voltage of such a device is then a logarithmic function of the light level. These devices show much wider dynamic range than do CCD devices, but are not as sensitive at low light levels because they operate in instantaneous-current mode rather than in integrating mode.

Photons absorbed in the neighborhood of a phototransistor collector-base or emitter-base junction create electron-hole pairs that are collected by the nearest p-n junction. Minority carriers collected by either junction act as base current, and are multiplied by the current gain of the transistor to produce the collector current. The emitter current is the sum of the base current and the collector current. For this reason, the emitter current is usually used as the output of the sensor.

Prior art phototransistor sensors suffer from low-current limitations. The current-gain of the phototransistor sensor device is high at high photocurrents, where it is not needed, and is low at low photocurrents, where it would desirably be higher. Because of this behavior of phototransistors, they have not found widespread use in commercial scanned imagers.

It is an object of the present invention to provide an improved single-chip serial-scanned imager, which can exhibit higher sensitivity at lower light levels than current mode imagers, and in the same device operate over a dynamic range larger than that achievable with CCD imagers.

BRIEF DESCRIPTION OF THE INVENTION

According to a first aspect of the present invention, a bipolar phototransistor used as a pixel comprises both an integrating photosensor and a select device. The base terminal of the bipolar phototransistor is utilized as the select node for the pixel.

A plurality of integrating photosensors according to the present invention may be placed in an array of rows and columns, wherein the base terminals of all bipolar phototransistors in a row are capacitively coupled to a common row-select line. The emitter of the bipolar phototransistor is the output node of the integrating photosensor. The output nodes of all integrating photosensors in a column are connected together to a column sense line. The integrating photosensor array is coupled to plurality of sense amplifiers, with a sense amplifier input connected to the sense line output of each column of integrating photosensors. An integrating sense amplifier according to the present invention includes an amplifying element having an inverting input is connected to the sense line. An MOS balance transistor is connected between the inverting input and the output of the amplifying element and a capacitor, preferably a varactor, is also connected between the inverting input and output of the amplifying element. In addition, in order to further extend the dynamic range, an exponential feedback element can be connected between the output and the inverting input of the amplifying element. In one embodiment of the invention, this feedback element includes a first P-channel feedback transistor having its source connected to the sense line and its gate and drain connected together to the source of a second P-channel feedback transistor. The gate of the second P-channel feedback transistor is connected to the output of the amplifying element, and its drain is connected to a fixed voltage source, such as ground. In another embodiment of the invention, this feedback element includes an N-channel MOS transistor having its source connected to the output of the amplifying element, its drain connected to the input of the amplifying element, and its gate connected to a source of fixed voltage.

DETAILED DESCRIPTION OF A PREFERRED EMBODIMENT

Figure 1:
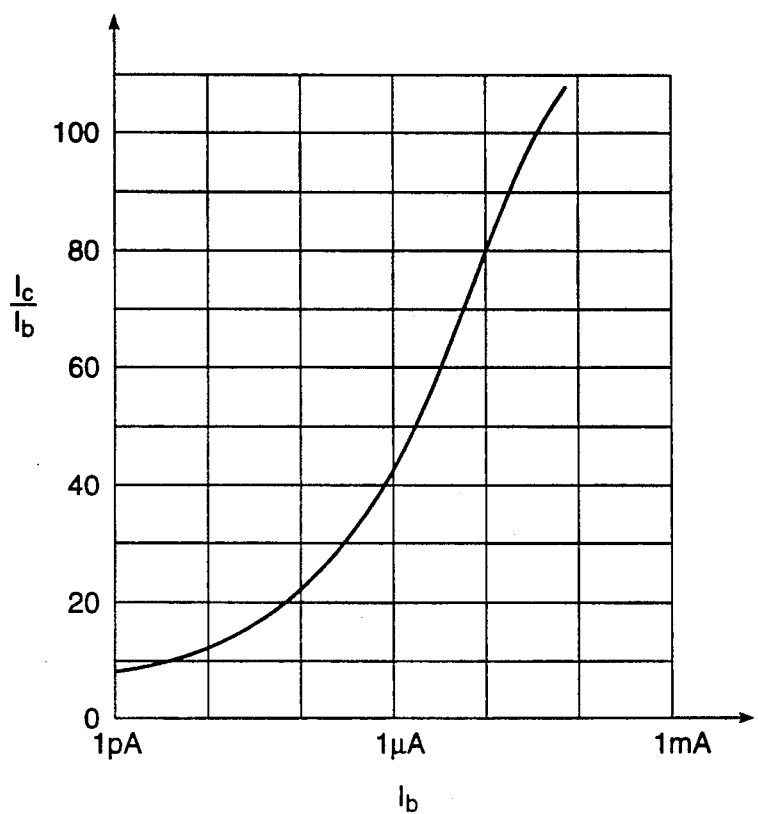
FIG. 1 is a graph showing the measured current gain of a typical phototransistor sensor device as a function of its base current.

The low-current limitation of a prior art phototransistor photosensor can be appreciated with reference to FIG. 1, which shows the measured current gain of a typical phototransistor sensor device as a function of its base current. It can be seen that the current-gain of the phototransistor photosensor device is high at high photocurrents, where it is not needed, and is low at low photocurrents, where it would desirably be higher. Because of this behavior, phototransistors have not found widespread use in commercial scanned imagers.

Figure 2A:
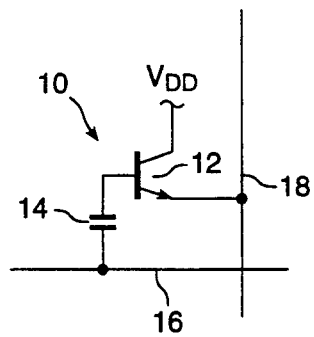
FIG. 2a, is a schematic diagram of an integrating photosensor according to a presently-preferred embodiment of the invention.

Referring now to FIG. 2a, a presently preferred pixel integrating photosensor circuit 10 suitable for use in a single-chip integrated circuit imaging array is shown. The photosensor circuit 10 comprises NPN phototransistor 12, having its collector connected to a source of positive voltage, shown as $V_{DD}$ in FIG. 2a. NPN phototransistor 12 preferably has a current gain larger than 100. A capacitor 14 is shown coupling the base of phototransistor 12 to a select line 16.

Coupling the base of phototransistor 12 to a select line 16 allows the phototransistor to also be used as a select device. The emitter of phototransistor is the output of the integrating photosensor and is connected to column sense line 18.

In a preferred implementation of the invention, a plurality of photosensor circuits 10 are formed in an N-well in a standard N-well CMOS integrated circuit fabrication process, with the single addition of a p-type base diffusion step. Because the N-well diffusion covers the entire photosensor array, the individual pixel circuits can be very dense since there are no large well-to-well spacing distances which waste semiconductor substrate area.

Figure 2B:
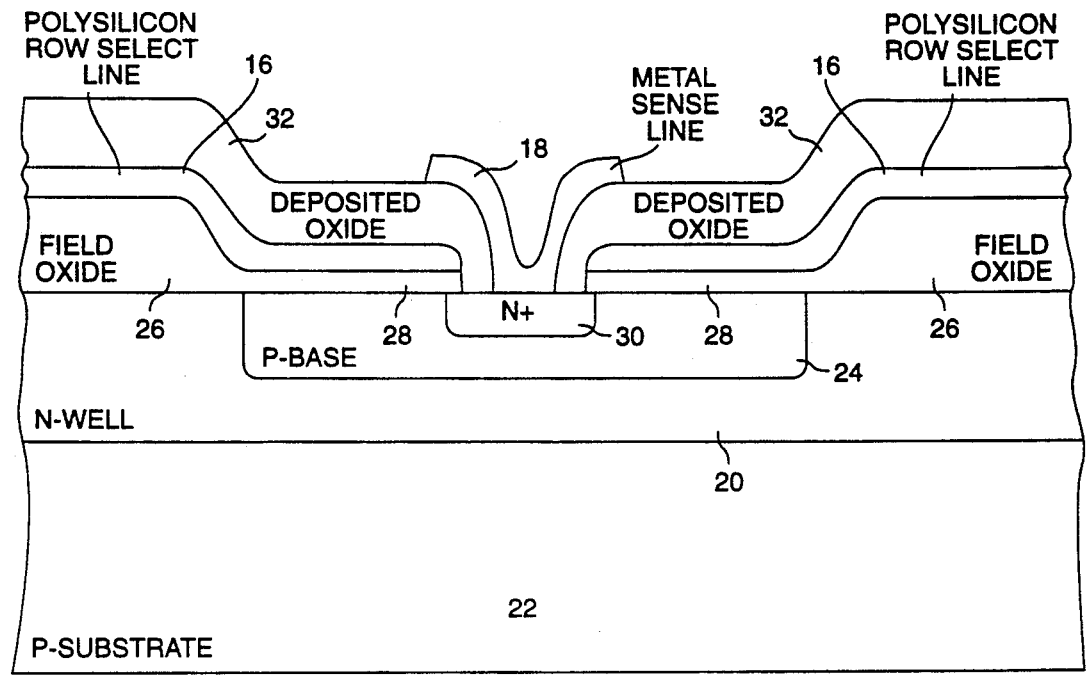
FIG. 2b is a cross sectional view of an embodiment of the circuit of FIG. 2a implemented in an N-well CMOS process.

Referring now to FIG. 2b, a cross section of a presently preferred embodiment of a photosensor circuit 10 in an N-well 15 CMOS process is shown. The entire array of photosensors 10 may be fabricated in N-well 20 formed in semiconductor substrate 22. N-well 20 forms the collector of all phototransistors 12 in the entire photosensor array. The p-base regions 24 of the individual phototransistors 12 are formed by implantation into regions of N-well 20 through apertures in a thick oxide layer 26. A gate oxide layer 28 forms the dielectric for capacitor 14, whose plates comprise p-type base region 24 and row-select line 16, comprising a polysilicon layer. An N+ region 30 in p-type base region 24 forms the emitter of phototransistor 12. N+ region 30 is formed by implanting an n-type dopant through an aperture in row-select line 16 and gate oxide layer 28. An oxide layer 32 is deposited over row-select line 16, and a metal contact to sense line 18 formed in oxide layer 32, using conventional semiconductor processing techniques.

Those of ordinary skill in the art will recognize that the integrating photosensor of the present invention may easily be integrated into a standard CMOS fabrication process. The step used to form the p-type base regions 24 is the only additional step necessary and is performed after field oxide formation and nitride strip or similar step. The gate oxide layer 28 and row select line 16 are formed during the steps which form the gate oxide and polysilicon gates of the MOS devices. The emitter 30 is formed during the n+ source/drain implant step and the sense line 18 is formed during the contact and metallization steps. All of these steps are already present in a standard CMOS fabrication process.

In a typical implementation in a one micron CMOS process, NPN phototransistor 12 may have a base region about 7 microns by 7 microns. The entire pixel may be 10 microns by 10 microns or less, allowing for a highly dense array and making it competitive with the high quality CCD imager circuits.

During normal circuit operation, row-select line 16 is held at a fixed voltage selected to reverse bias the base-emitter junction of phototransistor 12. Under this condition, the photocurrent integrates on capacitor 14. When it is desired to read out the state of a selected pixel, row-select line 16 is brought high, thereby forward biasing the base-emitter junction of phototransistor 12. Under this condition, the integrated photocurrent, multiplied by the current gain of phototransistor 12, flows from the emitter of phototransistor 12 onto column sense line 18.

Because the discharge occurs very rapidly, phototransistor 12 is operated at much higher currents than the photocurrent. At this higher current level, the current gain of phototransistor 12 is much higher than unity as shown in FIG. 1. The mode of operation contemplated by the present invention thereby allows many charge carriers to be delivered to sense line 20 for every photo-generated carrier collected by the base.

Figure 3:
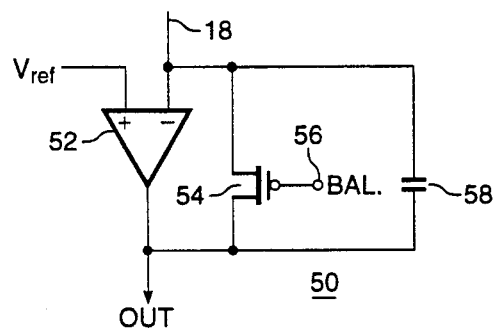
FIG. 3 is a prior art sense amplifier suitable for use in the present invention.

Referring now to FIG. 3, a typical integrating sense amplifier 50 suitable for sensing the charge delivered to sense line 18 by a single pixel is shown. Sense amplifier 50 includes an amplifying element 52, which may be an operational amplifier. The non-inverting input of amplifier 52 is connected to a source of reference voltage $V_{ref}$ and its inverting input is connected to sense line 18.

A P-channel balance transistor 54 is connected between the inverting input and the output of amplifier 52. Its gate is connected to a balance line 56. A capacitor 58 is also connected between the inverting input and output of amplifier 52.

Before row select line 16 is brought high to read a pixel value, amplifier 52 is brought into a known state by bringing the gate of p-channel balance transistor 56 low to turn it on, thereby effectively shorting the inverting input of amplifier 52 to its output and hence driving both input and output voltages to reference voltage $V_{ref}$. The gate of P-channel balance transistor 56 is then brought high, thereby isolating the input sense line 20 from the output of amplifier 52. The pixel is then addressed by bringing its row select line high, thus delivering its stored charge multiplied by the current gain of its phototransistor onto sense line 18.

Amplifier 52 will respond to this charge by maintaining its input at a nearly constant level by the feedback action of capacitor 58. The output voltage of amplifier 52 after the pixel has delivered all of its charge to sense line 50 will be lower than its initial value by that charge divided by the value of capacitor 58.

Figure 4A:
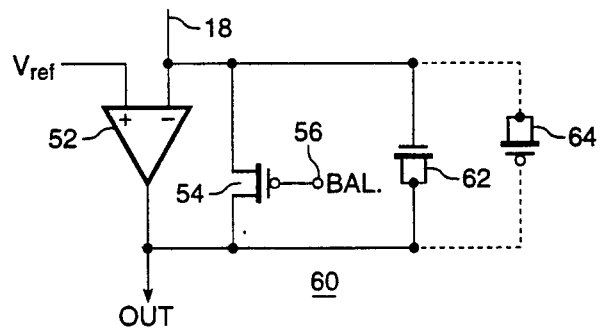
FIG. 4a is a schematic diagram of a presently-preferred sense for use in the present invention which provides signal compression.

The operation of the imaging array of the present invention at high light levels may be improved by using the sense amplifier shown in FIG. 4a. Sense amplifier 60 includes most of the elements of sense amplifier 50. These elements have been assigned the same reference numerals as the corresponding elements of FIG. 3. Thus, sense amplifier 60 includes an amplifying element 52, having its non-inverting input connected to a source of reference voltage $V_{ref}$ and its inverting input connected to sense line 18. P-channel balance transistor 54 is connected between the inverting input and the output of amplifier 52. Its gate is connected to a balance line 56.

However, in place of capacitor 58, a varactor structure is connected between the inverting input and output of amplifier 52 in the sense amplifier of FIG. 4a. Use of a varactor structure in place of capacitor 58 allows compression of the output signal over a wide dynamic range of input signals. As known in the art, and as illustrated in FIG. 4a, a varactor structure may comprise a large-area MOS transistor. The gate of the MOS transistor comprises one terminal of the varactor structure and the other terminal of the varactor structure comprises the source and drain of the MOS transistor connected together.

Either an N-channel MOS transistor or a P-channel MOS transistor may be used as the varactor according to the present invention. Because, in the presently illustrated application, a positive charge is to be sensed, if an N-channel MOS transistor is used as the varactor as indicated at reference numeral 62, its gate is connected to the input of amplifying element 52 and its source and drain are connected to the output of amplifying element 52. If a P-channel MOS transistor is used as the varactor as indicated at reference numeral 64 in phantom connection, its source and drain are connected to the input of amplifying element 52 and its gate is connected to the output of amplifying element 52. If a charge of the opposite sign is to be sensed, those of ordinary skill in the art will realize that the connections to the varactor will be reversed. If an application requires sensing charge of both polarities, two varactors connected in opposite directions may be used.

Figure 4B:
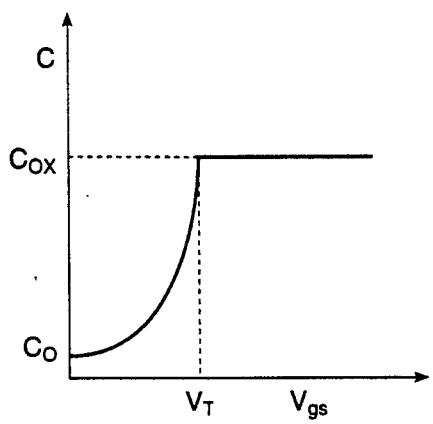
FIG. 4b is a graph showing the capacitance of the varactor structure of the sense amplifier of FIG. 4a as a function of voltage.

Referring now to FIG. 4b, a graph of varactor gate-to-source capacitance as a function of $V_{GS}$, the voltage across the capacitor, it may be seen that the capacitance from one terminal of the varactor structure to its other terminal varies with the voltage across the varactor device. At low gate to source voltages, the capacitance $C_0$ is small and is determined by the overlap of the gate with the source and drain diffusions. As the gate voltage approaches the threshold voltage $V_t$ of the MOS transistor, a channel begins to form under the gate, and the capacitance increases exponentially. Above the threshold voltage, the capacitance reaches the maximum value $C_{ox}$ set by the oxide capacitance of the entire area of the MOS transistor.

According to the present invention, the varactor is oriented in sense amplifier 60 such that the capacitance increases as the input charge increases. For this reason, the output voltage of the sense amplifier 60 per unit photosensor charge is a decreasing function of the total charge sensed. For example, for the NPN phototransistor 12 of FIG. 2a, a positive charge is sensed at the input of sense amplifier 60, causing the amplifier output to go negative from its balanced value. As the source of N-channel varactor 62 is made more negative than the gate, a channel is formed and the gate-to-source capacitance increases.

Figure 5:
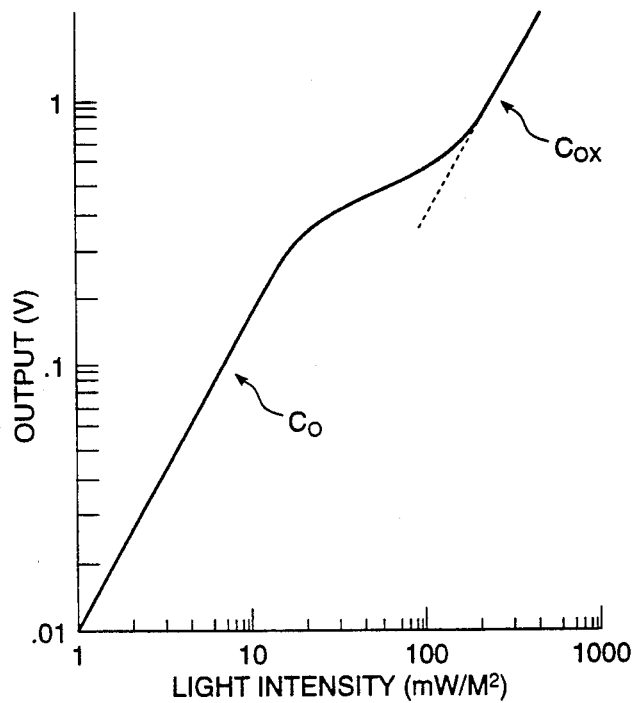
FIG. 5 is a graph showing the output voltage of the sense amplifier of FIG. 4a as a function of light intensity.

Referring now to FIG. 5, a typical graph of the output voltage of the sense amplifier 60 of FIG. 4a is shown as a function of light intensity. The voltage (Y) axis is calibrated in volts and the light-intensity (X) axis is calibrated approximately in $mW/meter^2$. The region past the knee of the curve in the graph of FIG. 5 represents the region where the capacitance of the varactor is increasing towards the value of $C_{ox}$. Varying the size of the varactor device will translate the curve along the X-axis. Reducing the minimum capacitance $C_0$ will translate the lower portion of the curve to the left. The horizontal displacement between the upper and lower portions of the curve of FIG. 5 is equal to the ratio of $C_{ox}$ to $C_0$.

As the level of light intensity is increased further, the upper portion of the curve of FIG. 5 will steepen to a slope of 1 on the log- scale of FIG. 5. To prevent this return to non-compressive behavior, the operation of the imaging array of the present invention at high light levels may be improved by using the sense amplifier shown in FIG. 6a. Sense amplifier 70 includes all of the elements of sense amplifier 60. These elements have been assigned the same reference numerals as the corresponding elements of FIG. 4a.

Figure 6A:
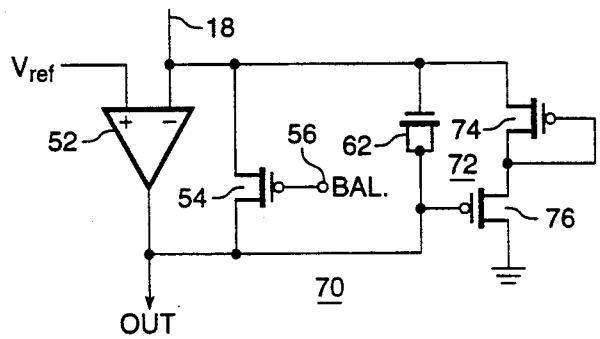
FIG. 6a is a schematic diagram of an alternative sense amplifier for use in the present invention incorporating a first exponential feedback element.

As may be seen from FIG. 6a, in addition to the elements of the sense amplifier circuit 60 of FIG. 4a, sense amplifier 70 includes an exponential feedback element 72. In a first embodiment, exponential feedback element 72 of sense amplifier 70 includes first and second P-channel feedback transistors 74 and 76. First P-channel feedback transistor 74 has its source connected to sense line 18, and its gate and drain connected together to the source of second P-channel feedback transistor 76. The gate of second P-channel feedback transistor 76 is connected to the output of amplifier 52, and its drain is 6 connected to a fixed voltage source, shown as ground in FIG. 6a.

The effect of first and second P-channel feedback transistors 74 and 76 is to provide a current which increases exponentially as the output voltage of amplifier 52 becomes more negative. This exponential function has a very small slope for output voltage excursions less than approximately 1 volt, thereby allowing sense amplifier 70 to function as a normal charge-sensing amplifier at low light levels. However, at higher light levels, by virtue of the current through the exponential element, sense amplifier 70 becomes a current-sensing amplifier, and its output voltage decreases as a logarithmic function of the input current from the pixel.

Those of ordinary skill in the art will recognize that the sense amplifier circuit of FIG. 6a automatically acts as both an integrating detector at low light levels, and as a current-mode detector at high light levels. The dynamic range of an imaging array may be greatly increased by use of the sense amplifier circuit of FIG. 6a.

Figure 6B:
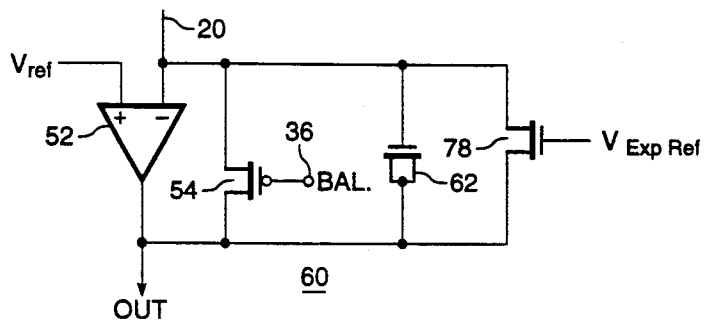
FIG. 6b is a schematic diagram of an alternative sense amplifier for use in the present invention incorporating a second exponential feedback element.

Referring now to FIG. 6b, an alternate embodiment of a sense amplifier with an exponential feedback element to improve its dynamic range is shown. The sense amplifier of FIG. 6b includes all of the elements of sense amplifier 70. These elements have been assigned the same reference numerals as the corresponding elements of FIG. 3. Thus, the sense amplifier of FIG. 6b includes an amplifying element 52, having its non-inverting input connected to a source of reference voltage $V_{ref}$ and its inverting input connected to sense line 18. P-channel balance transistor 54 is connected between the inverting input and the output of amplifier 52. Its gate is connected to a balance line 56. Varactor 62 is connected between the output and inverting input of amplifying element 52.

N-channel MOS transistor 78 is connected as an exponential feedback element with its source connected to the output of amplifying element 52 and its drain connected to the inverting input of amplifying element 52. Its gate is connected to a source of fixed voltage. $V_{Exp\ Ref}$. As more positive charge is sensed by amplifying element 52, its output becomes more negative. As the output decreases below $V_{Exp\ Ref}$, the current through MOS transistor 78 begins to increase exponentially with decreasing output voltage. The amplifier then becomes a current-sensing amplifier with an output voltage logarithmic in input voltage. The magnitude of the fixed voltage source $V_{Exp\ ref}$ should be chosen such that the logarithmic compression occurs just as the varactor has achieved its maximum capacitance $C_{Ox}$.

Figure 7A:
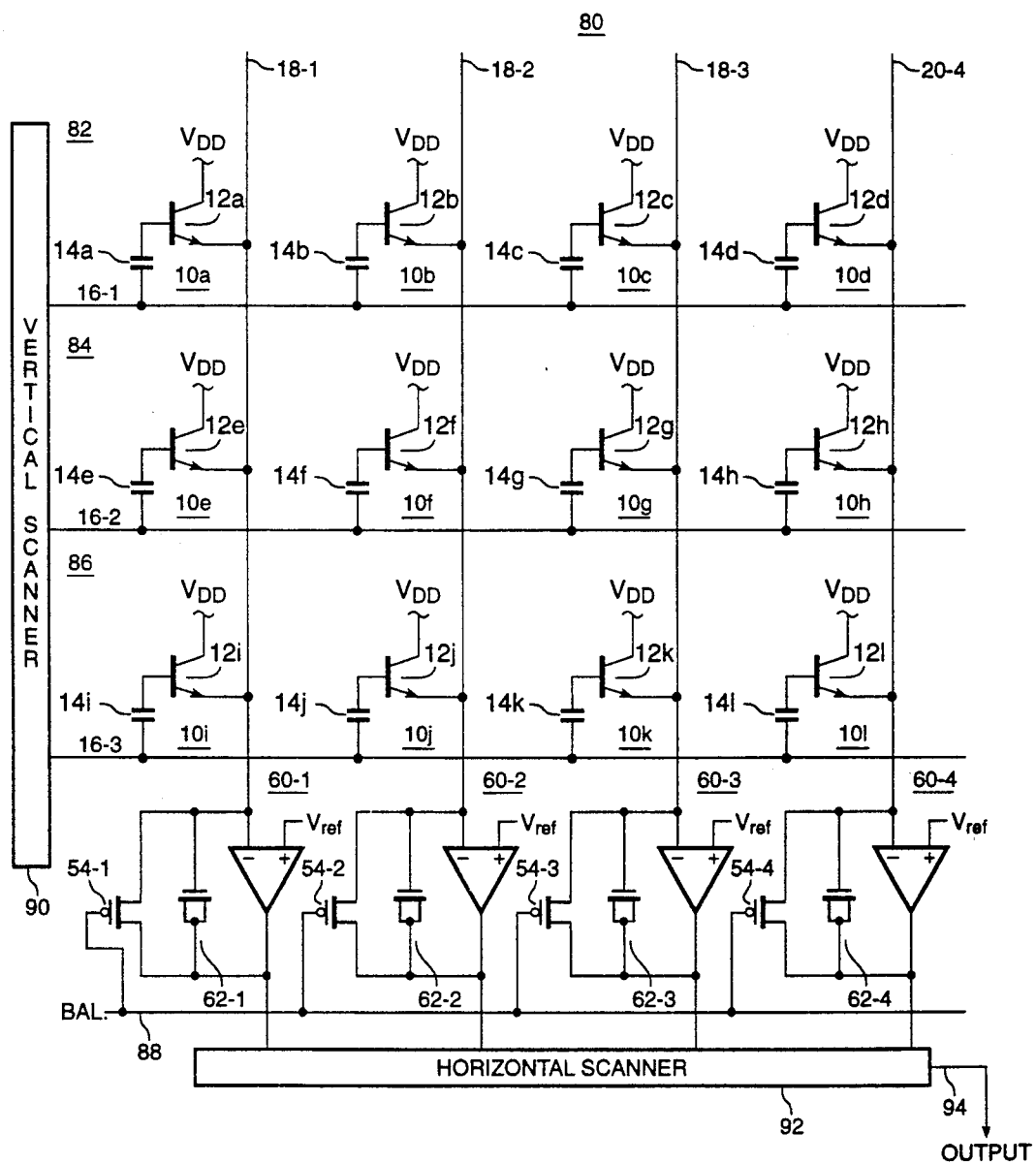
FIG. 7a is a block diagram of an imaging array comprising bipolar transistor integrating photosensors according to a presently preferred embodiment of the invention.

Referring now to FIG. 7a, an integrating imaging array according to a presently preferred embodiment of the invention is illustrated. The array 80 of FIG. 7a is shown including twelve integrating photosensors according to the present invention arranged into three rows and four columns. Those of ordinary skill in the art will readily observe that the embodiment shown in FIG. 7a is illustrative and not limiting in nature, and that an array of any size is contemplated by the present invention, limited only by the inherent density and chip size limitations of CMOS technology.

Row 82 of array 80 includes photosensors 10a-10d. Row 84 of array 80 includes photosensors 10e-10h. Row 86 of array 80 includes photosensors 10i-10l. In FIG. 7a, photosensors 10a-10l are illustrated as the bipolar integrating photosensors of FIG. 2a. Those of ordinary skill in the art will recognize that other integrating photosensor elements may be used in place of the integrating photosensor element of FIG. 2a.

First row-select line 16-1 is connected to one plate of capacitors 14a-14d. Second row-select line 16-2 is connected to one plate of capacitors 14e-14h. Third row-select line 16-3 is connected to one plate of capacitors 14i-14l. First sense line 18-1 is connected to the emitters of phototransistors 12a, 12e, and 12i of the first column in the array 80. Second sense line 18-2 is connected to the emitters of phototransistors 12b, 12f, and 12j of the second column in the array 80. Third sense line 18-3 is connected to the emitters of phototransistors 12c, 12g, and 12k of the third column in the array 80. Fourth sense line 18-4 is connected to the emitters of phototransistors 12d, 12h, and 12l of the fourth column in the array 80.

First sense amplifier 60-1 is connected to first sense line 18-1. Second sense amplifier 60-2 is connected to second sense line 18-2. Third sense amplifier 60-3 is connected to third sense line 18-3. Fourth sense amplifier 60-4 is connected to fourth sense line 18-4. As will be apparent from the discussion accompanying FIG. 2a, a row of pixels from array 80 may be read by pulsing balance line 88, followed by bringing the desired one of row lines 16-1 through 16-4 to a high logic level. Sense amplifiers 60-1 through 60-4 may be any of the sense amplifiers disclosed herein, or may be any other appropriate sense amplifier which those of ordinary skill in the art will be readily able to select.

In a presently preferred embodiment, a vertical scanning circuit 90 is adapted to select only one of the row select lines 18 at any given time. Circuits for performing this function are well known in the art. In a true serial scanned imager, horizontal scanning circuitry 92 is adapted to select the signal from the output of one of amplifiers 60 at a given time, to form the output 94 of the array. Exemplary scanning circuits suitable for use as vertical and horizontal scanning circuits 90 and 92 are described in Analog VLSI and Neural Systems, by Carver A. Mead, Addison Wesley Publishing Co., 1989, at pp. 263-267. If parallel outputs are desired, all or a subset of amplifier outputs can be used directly without employing horizontal scanning circuit 92.

Figure 7B:
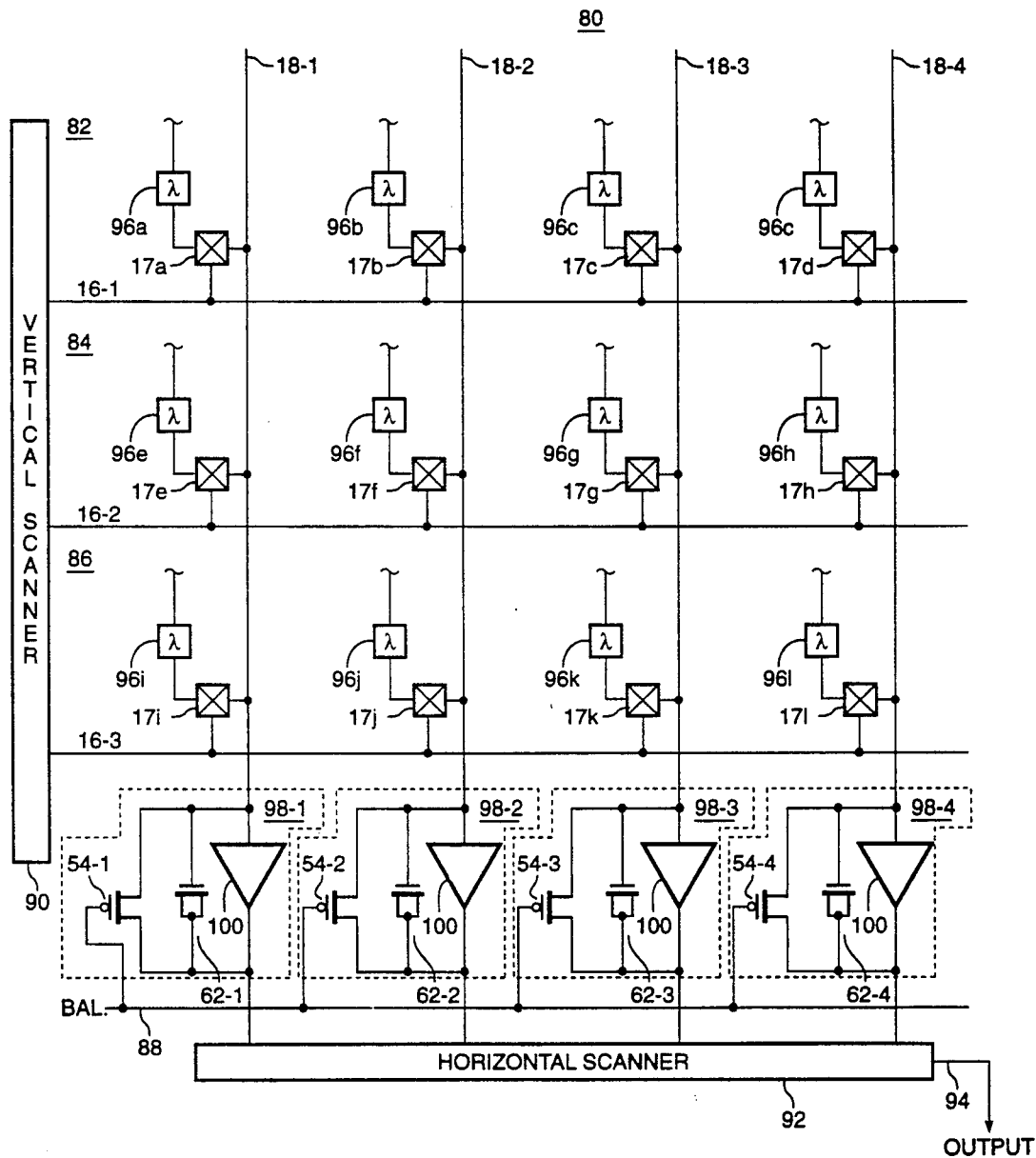
FIG. 7b is a block diagram of an imaging array comprising integrating according to a presently preferred embodiment of the invention.

Referring now to FIG. 7b, a block diagram of a more generalized version of an integrating imaging array according to 22 the present invention is depicted. Integrating photosensors 96a-96l are shown as rectangular boxes. Those of ordinary skill in the art will readily understand that integrating photosensors 96a-96l may comprise phototransistors, photodiodes and other integrating photosensor elements. The array structure of the array of FIG. 7b is otherwise much the same as that of the array of FIG. 7a.

Switching elements 17a-17l act to connect the elements of the single row selected by row scanner 82 to the column lines 201 through 20-4. Numerous circuit elements, such as single MOS transistors, junction FETs, and bipolar transistors, etc., may be used as switching elements 16a-16l. In the preferred embodiment of the pixel shown in FIG. 2a, the bipolar phototransistor itself is also used as the switching element as was illustrated in FIG. 7a.

In addition, sense amplifiers 98-1 through 98-4 are also shown generically including amplifying elements 100. Persons of ordinary skill in the art will appreciate that sense amplifiers 98-1 to 98-4 (shown within dashed lines) may be any of the sense amplifiers disclosed in FIGS. 3, 4a, 6a, and 6b herein, or may be other appropriate sense amplifiers which those of ordinary skill in the art will be able to select. Although sense amplifiers 98-1 through 98-4 are shown including MOS balance transistors 54-1 through 54-4 and varactor elements 62-1 through 62-4, those of ordinary skill in the art will recognize that the compressive feedback functions may be omitted or can be achieved by other means.

The remaining elements of the integrating imaging array of FIG. 7b are the same as the corresponding elements of the integrating imaging array of FIG. 7a. The integrating imaging array of FIG. 7b functions in the manner described for the array of FIG. 7a.

Figure 8A:
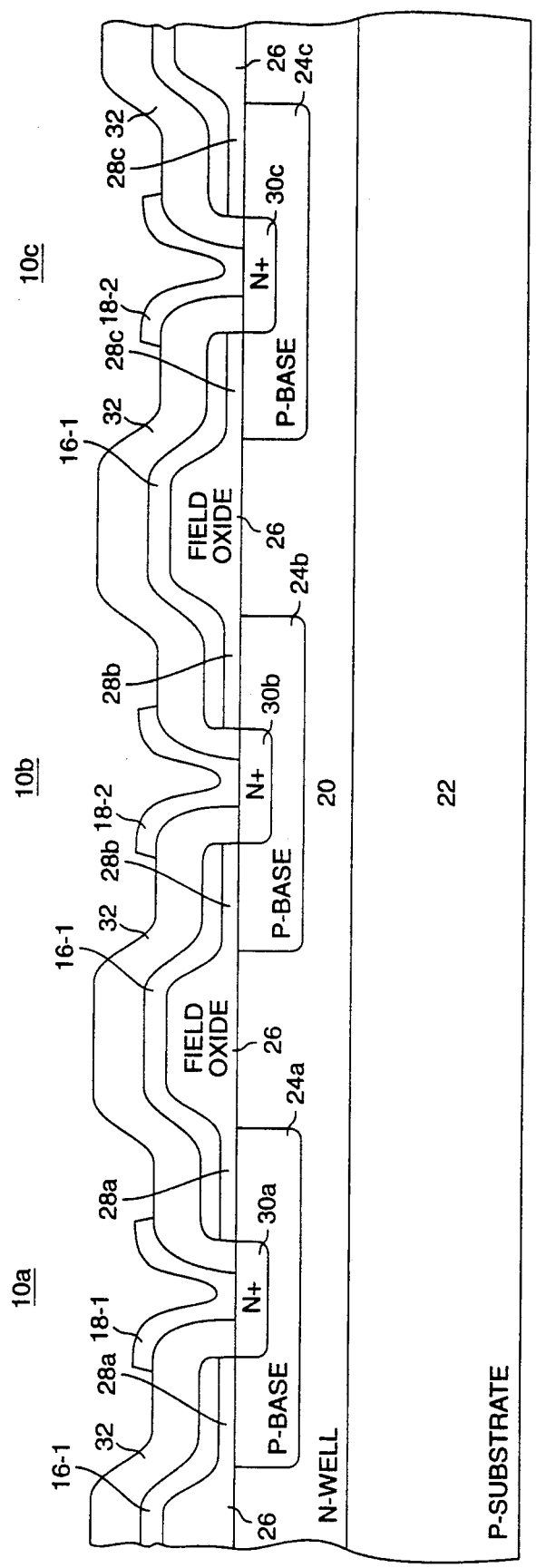
FIG. 8a is a cross-sectional view of a portion of an array of integrating photosensors according to a presently preferred embodiment of the invention implemented in an N-well CMOS process taken along an axis parallel to one row thereof in a position which bisects a row-select line of the array.
Figure 8B:
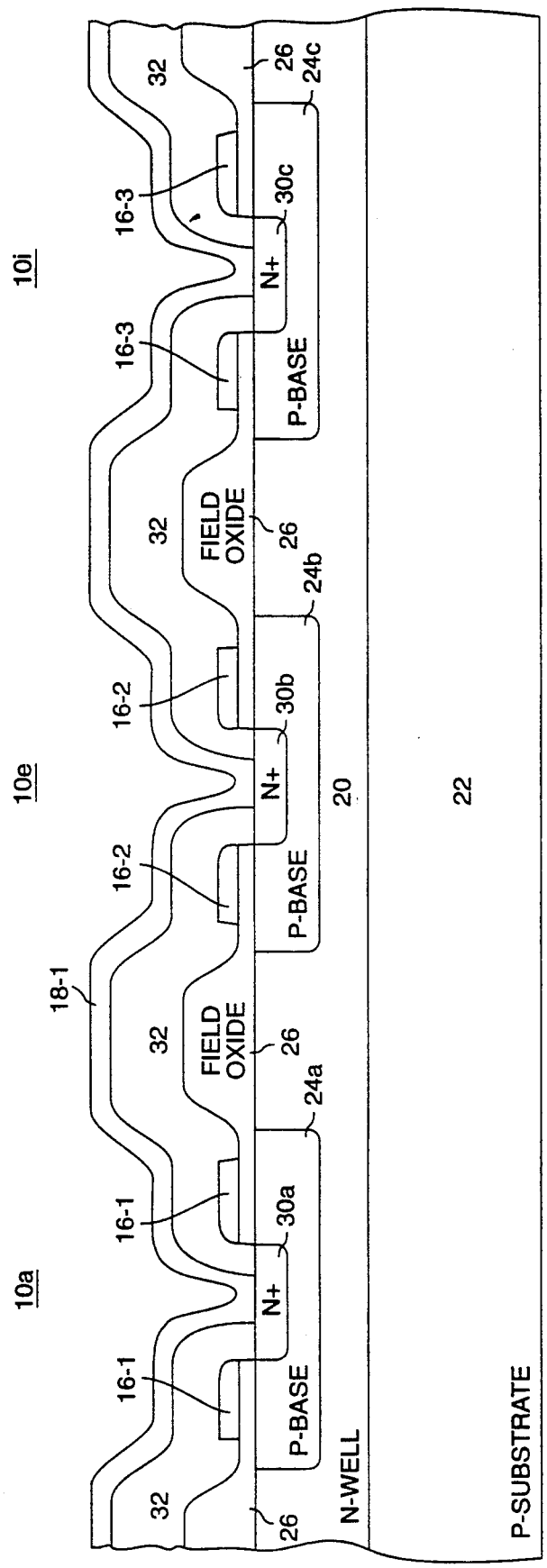
FIG. 8b is another cross-sectional view of the integrating photosensor array shown in FIG. 8a, taken along an axis parallel to a column thereof in a position which bisects a column sense line of the array.

Referring now to FIGS. 8a and 8b, cross-sectional views of an N-well CMOS embodiment of the integrating photosensor array of FIG. 7a using the integrating photosensor of FIGS. 2a and 2b are shown. FIG. 8a is oriented along an axis parallel to the rows of the array. The cross-section of FIG. 8a bisects a row-select line of the array. The axis of FIG. 8b is orthogonal to that of FIG. 8a, and thus runs parallel to a column of the array. The cross-section of FIG. 8b bisects a column sense line of the array. The portion of the array shown in FIGS. 8a and 8b includes three rows and three columns of integrating photosensors.

Those of ordinary skill in the art will readily understand that this embodiment is merely illustrative and that practical arrays fabricated according to the principles of the present invention are likely to be substantially larger. The practical limit on array size is largely a function of CMOS processing limitations. The reference numerals used in FIGS. 8a and 8b will be the same as the reference numerals used for the same elements shown in FIG. 2b and 7a.

In FIG. 8a, array 80 is shown to include an exemplary row 82 of integrating photosensors including photosensors 10a, 10b, and 10c, fabricated in N-well 20, formed in p-type substrate 22 using conventional processing techniques. Although FIG. 7a illustrates a row including four integrating photosensors, only three photosensors 10a, 10b, and 10c are shown for simplicity in row 82 of FIG. 8a. Integrating photosensors 10a, 10b, and 10c may be separated by conventionally formed field oxide regions 26, as is well known in the art.

P-type base regions 24a, 24b, and 24c, formed in regions of N-well 20 between birds beaks or in apertures etched in a uniformly grown field oxide 26, comprise the base regions of the NPN bipolar transistors comprising integrating photosensors 10a, 10b, and 10c, respectively. The minimum inter-pixel distance is set by the inter-base spacing. The base doping is chosen such that the base surface concentration is larger than the well-surface concentration but light enough so that the base-emitter reverse leakage characteristic is not degraded by incipient breakdown at the reverse bias voltage used for integrating the photo-generated charge.

N+ emitter regions 30a, 30b, and 30c, form the emitters of bipolar transistor integrating photosensors 10a, 10b, and 10c, respectively. Conductive row-select line 16-1 comprises a line of conductive material, such as polysilicon, metal silicide or any other conductive layer which may be employed as a gate in a CMOS process. Row-select line 16-1 line runs the length of the row 82 over field oxide regions 26 and gate oxide regions 28a, 28b, and 28c. Deposited oxide layer 32 covers row-select line 16-1. Column sense lines 18-1, 18-2, and 18-3 are shown in end view disposed over deposited oxide layer 32 and contacting emitters 30a, 30b, and 30c of integrating photosensors 10a, 10b and 10c, respectively.

FIG. 8b is a cross-sectional view taken along the first column of array 80 in a location which bisects metal column sense line 18-1 of FIG. 7a. Column sense line 18-1 is shown running the length of the column and contacting emitters 30a, 30e, and 30i of integrating photosensors 10a, 10e, and 10i.

While, in FIG. 8a, row-select line 16-1 appears to be discontinuous, those of ordinary skill in the art will recognize that this is because the axis of the cross section bisects apertures in row line 16-1 used to define the emitters 30a, 30b, and 30c of photosensors 10a, 10b, and 10c. Metal contact vias are used to connect emitters 30a, 30b, and 30c to their respective column sense lines. Examination of FIGS. 8a and 8b together reveals that the contact vias pass through continuous conductive row-select lines which are insulated from the metal column sense lines 18-1, 18-2, and 18-3 by deposited oxide 32 and from base regions 24a, 24b, and 24c by thin gate oxide regions 28a, 28b, 28c.

Examination of both FIGS. 8a and 8b also reveals that the emitter regions are substantially self aligned to the edges of the polysilicon layers forming row-select lines 16-1, 16-2, and 16-3. This is a result of the fact that the emitter regions are created during the self-aligned gate source/drain implant step simultaneously with the sources and drains of the MOS transistors on the integrated circuit. Those of ordinary skill in the art will realize that this provides the advantage of minimizing the emitter-to-row-select-line capacitance in the integrating photosensors.

While a presently-preferred embodiment of the invention has been disclosed, those of ordinary skill in the art will, from an examination of the within disclosure and drawings be able to configure other embodiments of the invention. For example, those of ordinary skill in the art will readily observe that the array of the present invention may be rearranged by a simple rotation to interchange the roles of its rows and its columns, or two such arrays can be interspersed on offset centers to form a hexagonal, rather than a square, array. The invention may be easily fabricated in a P-well CMOS process, and that, in such an embodiment, the voltage levels and power supplies would be reversed. These other embodiments are intended to fall within the scope of the present invention which is to be limited only by the scope of the appended claims.

What is claimed is:

1. An integrating imaging array disposed on a single piece of semiconductor substrate material, including:

a plurality of integrating photosensors arranged in an array of rows and columns, each of said photosensors comprising a bipolar phototransistor having a collector connected to a fixed voltage source, an emitter connected to a sense node, and a base connected to one end of a capacitor, the other end of said capacitor connected to a select node;

a plurality of row lines, a unique one of said row lines associated with each particular row in said array, all of the select nodes of the integrating photosensors in a single one of said rows connected to the unique one of said row lines associated therewith;

a plurality of sense lines, a unique one of said sense lines associated with each particular column in said array, all of the sense nodes of the integrating photosensors in a single one of said columns connected to the unique one of said sense lines associated therewith; and a plurality of sense amplifiers, each of said sense amplifiers having an inverting input and an output, the input of one of said sense amplifiers connected to each of said sense lines, each of said sense amplifiers further includes a varactor element connected between its said inverting input and its said output.

2. The integrated imaging array of claim 1 wherein said varactor element of each of said sense amplifiers comprises an MOS transistor having its gate connected to said inverting input of said sense amplifier and its source and drain connected to said output of said sense amplifier.

3. The integrated imaging array of claim 1 wherein said varactor element of each of said sense amplifiers comprises an MOS transistor having its gate connected to said output of said sense amplifier and its source and drain connected to said inverting input of said sense amplifier.

4. The integrated imaging array of claim 1 wherein each of said sense amplifiers further includes means for selectively connecting its said output to its said input.

5. The integrating imaging array of claim 4 wherein said means for selectively connecting comprises an MOS transistor connected between said input node and said output node, said MOS transistor having its gate connected to a balance input node.

6. The integrated imaging array of claim 1, further including:
means for selecting one of said rows; and
means for adapting said sense amplifier to a known state when none of said rows is selected.

7. An integrating imaging array disposed on a single piece of semiconductor substrate material, including:
a plurality of integrating photosensors arranged in a matrix including a plurality of rows and columns, each of said integrating photosensors including an integrating photosensitive element, a sense node, and an enable node,
a semiconductor switch connected between said integrating photosensitive element and said sense node, said semiconductor switch having a control input connected to said enable node;
a plurality of row lines, a unique one of said row lines associated with each particular row in said array, the enable nodes of all of said integrating photosensors associated with said particular row connected to said unique one of said row lines;
a plurality of sense lines, a unique one of said sense lines associated with each particular column in said array, the sense nodes of all of said integrating photosensors associated with said particular column connected to said unique one of said column lines; and
a plurality of sense amplifiers, each of said sense amplifiers having an inverting input and an output, the input of one of said sense amplifiers connected to each of said sense lines, each of said sense amplifiers further including a varactor element connected between its said inverting input and is said output.

8. The integrated imaging array of claim 7 wherein said varactor element of each of said sense amplifiers comprises an MOS transistor having its gate connected to said inverting input of said sense amplifier and its source and drain connected to said output of said sense amplifier.

9. The integrated imaging array of claim 7 wherein said varactor element of each of said sense amplifiers comprises an MOS transistor having its gate connected to said output of said sense amplifier and its source and drain connected to said inverting input of said sense amplifier.

10. The integrated imaging array of claim 7 wherein each of said sense amplifiers further includes means for selectively connecting its said output to its said inverting input.

11. The integrating imaging array of claim 10 wherein said means for selectively connecting comprises an MOS transistor connected between said input node and said output node, said MOS transistor having its gate connected to a balance input node.

12. The integrated imaging array of claim 7, further including:
means for selecting one of said rows; and
means for adapting said amplifier to a known state when no one of said rows is selected.

13. The integrating imaging array of claim 7 wherein each of said integrating photosensors comprises a bipolar phototransistor having a base, an emitter, and a collector, said collector connected to a voltage source, and said emitter connected to said semiconductor switch.

14. The integrating imaging array of claim 7 wherein each of said integrating photosensors comprises a photodiode.

15. An integrating imaging array disposed on a single piece of semiconductor substrate material of a first conductivity type, including:
a plurality of integrating photosensors disposed in a well of a second conductivity type opposite to said first conductivity type, said plurality of integrating photosensors arranged in a matrix including a plurality of rows and columns, each of said photosensors comprising a bipolar phototransistor having a collector region formed by said well, a base region formed from a region of said first conductivity type disposed in said well, and an emitter region formed from a region of said second conductivity type disposed in said base region, said well connected to a voltage source;
a capacitor dielectric layer formed over said base regions of said bipolar phototransistors;
a plurality of row lines, a unique one of said row lines associated with each one of said rows in said array, each of said row lines comprising a conductive strip disposed over said capacitor dielectric layer in a region lying over a portion of the base regions of the ones of said bipolar phototransistors in the one of said rows with which it is associated, each of said strips including a plurality of first-sized apertures therein, each of said apertures extending through said capacitor dielectric and substantially self aligned with the emitter region of a different one of said bipolar phototransistors, said strips, said capacitor dielectric layer and said base regions acting to capacitively couple said base regions of the ones of said bipolar phototransistors associated with each of said corresponding rows to the unique one of said row lines associated therewith;
an insulating layer covering said polysilicon strips, said insulating layer including a plurality of second-sized contact apertures therein, said second-sized contact apertures substantially aligned with said first-sized apertures and extending through said insulating layer to said emitter regions, said second-sized contact apertures being sized smaller than sad first-sized apertures so as to prevent contact to said conductive strips; and a plurality of conductive sense lines disposed over said second insulating layer and disposed in a direction generally orthogonal to said conductive strips, a unique one of said sense lines associated with each of said columns in said array, the emitters of all of the ones of said integrating photosensors in each column connected to the unique one of said sense line with which that column is associated through ones of said second-sized contact apertures;

a plurality of sense amplifiers, each of said sense amplifiers having an inverting input and an output, the input of one of said sense amplifiers connected to each of said sense lines, each of said sense amplifiers further including a varactor element connected between its said inverting input and its said output.

16. The integrating imaging array of claim 15 further including a plurality of sense amplifiers, each of said sense amplifiers having an input and an output, the input of one of said sense amplifiers connected to each of said sense lines.

17. The integrating imaging array of claim 16, wherein the input of each of said sense amplifiers is an inverting input and wherein each of said sense amplifiers further includes a varactor element connected between its said inverting input and its said output.

18. The integrated imaging array of claim 15 wherein said varactor element of each of said sense amplifiers comprises an MOS transistor having its gate connected to said inverting input of said sense amplifier and its source and drain connected to said output of said sense amplifier.

19. The integrated imaging array of claim 15 wherein said varactor element of each of said sense amplifiers comprises an MOS transistor having its gate connected to said output of said sense amplifier and its source and drain connected to said inverting input of said sense amplifier.

20. The integrated imaging array of claim 15 wherein each of said sense amplifiers further includes means for selectively connecting its output to its inverting input.

21. The integrating imaging array of claim 20 wherein said means for selectively connecting comprises an MOS transistor connected between said input node and said output node, said MOS transistor having its gate connected to a balance input node.

22. The integrated imaging array of claim 15, further including:
means for selecting one of said rows; and
means for adapting said amplifier to a known state when none of said rows is selected.

23. The integrated imaging array of claim 15, further including:
means for serially selecting each of said rows in order; and
means for serially scanning the outputs of said sense amplifiers when each of said rows has been selected.

* * * * *